(12) United States Patent
Iwasaki

(10) Patent No.: US 10,325,797 B2
(45) Date of Patent: Jun. 18, 2019

(54) PURGING DEVICE AND PURGING METHOD

(71) Applicant: MURATA MACHINERY, LTD., Kyoto-shi, Kyoto (JP)

(72) Inventor: Junji Iwasaki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 240 days.

(21) Appl. No.: 15/508,503

(22) PCT Filed: Jul. 23, 2015

(86) PCT No.: PCT/JP2015/071011
§ 371 (c)(1),
(2) Date: Mar. 3, 2017

(87) PCT Pub. No.: WO2016/047260
PCT Pub. Date: Mar. 31, 2016

(65) Prior Publication Data
US 2017/0278736 A1 Sep. 28, 2017

(30) Foreign Application Priority Data

Sep. 25, 2014 (JP) .................. 2014-195152

(51) Int. Cl.
*H01L 21/677* (2006.01)
*H01L 21/54* (2006.01)
*H01L 21/673* (2006.01)
*G05D 7/06* (2006.01)
*H01L 21/67* (2006.01)

(52) U.S. Cl.
CPC ........ *H01L 21/67778* (2013.01); *H01L 21/54* (2013.01); *H01L 21/6773* (2013.01); *H01L 21/67389* (2013.01); *H01L 21/67733* (2013.01); *H01L 21/67736* (2013.01);
(Continued)

(58) Field of Classification Search
CPC .............................. H01L 21/677; H01L 21/54
See application file for complete search history.

(56) References Cited

U.S. PATENT DOCUMENTS

2008/0240892 A1 10/2008 Courtois et al.
2010/0047045 A1 2/2010 Park et al.
(Continued)

FOREIGN PATENT DOCUMENTS

WO 2014/104895 A1 7/2014

OTHER PUBLICATIONS

Official Communication issued in corresponding European Patent Application No. 15845065.0, dated Apr. 17, 2018.

*Primary Examiner* — Scott R Kastler
(74) *Attorney, Agent, or Firm* — Keating & Bennett, LLP

(57) ABSTRACT

Containers are purged between overhead transfer vehicles and a container transfer location to or from which the containers are transferred. A travelling rail for a local vehicle is provided below a travelling rail for the overhead transfer vehicles and above the container transfer location, and a local vehicle travels along the travelling rail and includes a hoist that raises and lowers the containers. A purging table that supports the containers is provided below the travelling rail for the local vehicle so as not to block a portion over the container transfer location and a purging gas feeding device feeds a purging gas into the containers supported on the purging table.

6 Claims, 6 Drawing Sheets

(52) U.S. Cl.
CPC ......... *H01L 21/67766* (2013.01); *G05D 7/06* (2013.01); *H01L 21/67017* (2013.01); *H01L 21/67769* (2013.01)

(56) References Cited

U.S. PATENT DOCUMENTS

| | | |
|---|---|---|
| 2012/0275886 A1 | 11/2012 | Ota |
| 2015/0235884 A1 | 8/2015 | Jang et al. |
| 2015/0340253 A1* | 11/2015 | Oosterlaken ...... H01L 21/67733 414/172 |
| 2017/0278736 A1* | 9/2017 | Iwasaki .................. H01L 21/54 |

* cited by examiner

F I G. 2
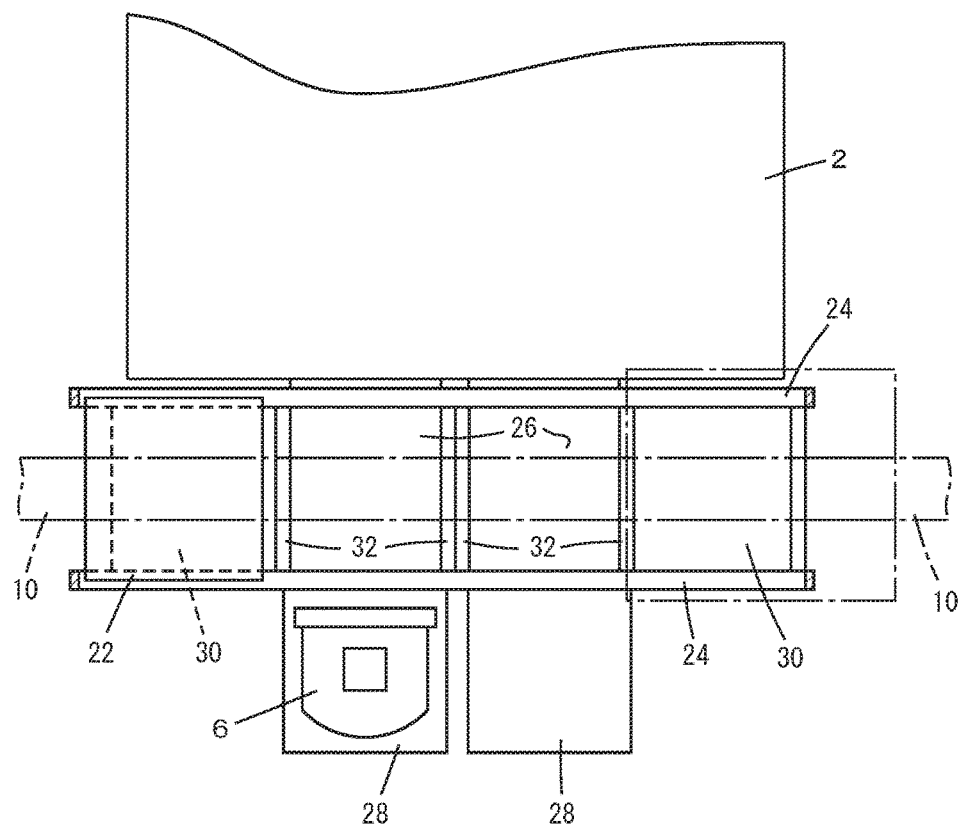

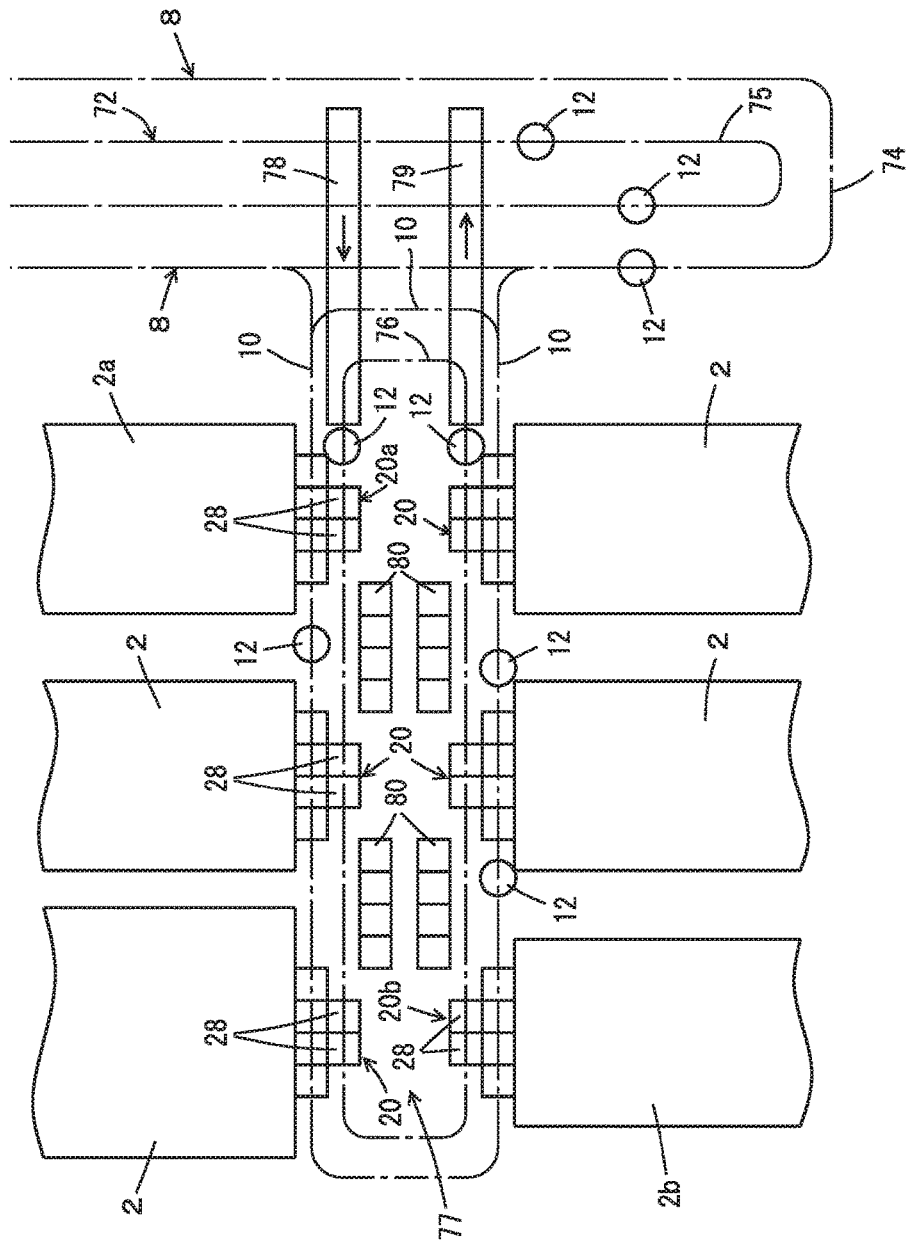

PURGING DEVICE AND PURGING METHOD

BACKGROUND OF THE INVENTION

1. Field of the Invention

The present invention relates to purging of containers accommodating semiconductor wafers or other articles, for example.

2. Description of the Related Art

In semiconductor factories, cassettes for accommodating semiconductor wafers are transferred by an overhead transfer system between load ports of processing equipment. Japanese Patent Document 5229363 discloses, as a temporary buffer between the overhead transfer system and the load ports, an apparatus including a local vehicle, its travelling rail, and a buffer between the load ports and the travelling rail for the overhead transfer vehicles. In the apparatus disclosed in Japanese Patent Document 5229363B, the cassettes may vertically pass through a gap between a pair of travelling rails for the local vehicle, and the buffer under the travelling rails for the local vehicle allows both the overhead transfer vehicles and the local vehicle to access.

In addition, stockers for storing the cassettes having a purging function to purge the cassettes by nitrogen ($N_2$) gas, etc., have been known. However, in other places than the stocker, purging is not possible.

When containers are purged with $N_2$ and so on during transfer from one piece of processing equipment to the next piece of processing equipment, then, problems such as oxidation of the wafer surface are reduced. The purge increases the allowance time for the transfer to the next piece of processing equipment. However, it is not realistic to provide a purging apparatus within processing equipment, since it needs a large-scale remodeling of processing equipment. Therefore, a purging apparatus is necessary in the vicinity of processing equipment.

SUMMARY OF THE INVENTION

Preferred embodiments of the present invention provide an apparatus that is able to purge containers in a vicinity of a transfer location such as a load port.

A purging apparatus according to a preferred embodiment of the present invention purges containers between overhead transfer vehicles and at least a container transfer location to or from which the containers are transferred, the purging apparatus including at least a local vehicle that travels and includes a hoist that raises and lowers the containers; at least a travelling rail for the local vehicle, provided below a travelling rail for the overhead transfer vehicles and above the container transfer location; a purging table that supports the containers, provided below the travelling rail for the local vehicle so as not to block a portion over the container transfer location (e.g., to be positioned so as not to occupy a space above the container transfer location); and a purging gas feeding device that feeds a purging gas into the containers supported on the purging table.

A purging method according to a preferred embodiment of the present invention uses a purging apparatus that includes at least a local vehicle that travels and includes a hoist that raises and lowers containers, at least a travelling rail for the local vehicle, provided below a travelling rail for overhead transfer vehicles and above a container transfer location to or from which containers are transferred, a purging table that supports the containers, provided below the travelling rail for the local vehicle so as not to block a portion over the container transfer location (e.g., to be positioned so as not to occupy a space above the container transfer location), and a purging gas feeding device that feeds a purging gas into the containers supported on the purging table, the purging method including placing the containers temporarily on the purging table between the overhead transfer vehicles and the container transfer location, and purging the containers with the purging gas by the purging gas feeding device.

According to preferred embodiments of the present invention, containers waiting to be transferred by the overhead transfer vehicles are purged in the vicinity of a container transfer location. Articles to be accommodated within the containers are, for example, semiconductor wafers, foods, medicines, and so on, and purging of containers after the processing of articles reduces problems such as contamination and oxidation of the articles during the wait time for the next processing or the like. When the containers are purged before the processing of the articles, the surfaces of the articles are preferably cleaned in advance. In preferred embodiments of the present invention, the hoist corresponds to raising and lowering devices and the like, for example, and the container transfer location corresponds to load ports of processing equipment and the like, for example. In addition, the purging table corresponds to slide shelves and fixed shelves and the like, for example, in preferred embodiments of the present invention. In this specification, descriptions concerning the purging apparatus are applicable to the purging method.

Preferably, the purging table includes at least a slide shelf that slides between a position different from the portion over the container transfer location (e.g., a position so as not to occupy a space above the container transfer location) and the portion (e.g., the space above the container transfer location). With the usage of the slide shelf, the overhead transfer vehicles are able to transfer the containers between the container transfer location without travelling, and the sliding direction of the slide shelf is, for example, perpendicular or substantially perpendicular to the travelling direction of the local vehicle in a horizontal plane.

Preferably, the purging table further includes at least a fixed shelf other than the slide shelf, and a controller of the purging apparatus that is configured or programmed to control the local vehicle and to select a shelf to support a container from the slide shelf and the fixed shelf in such a way that a container to be transferred to the container transfer location is preferentially purged in the slide shelf (e.g., while supported by the slide shelf) to the other containers. The capacity of the purging table is able to be increased by the fixed shelf, and containers to be transferred to the container transfer location are more promptly transferred.

Preferably, the purging apparatus is provided in a ceiling space of a cleanroom and receives the purging gas from a ceiling of the cleanroom. As a result of being installed in the ceiling space, the purging apparatus does not occupy a floor space, and since pipes for the purging gas such as $N_2$ and dry clean air are already often provided in the ceiling, supply of the purging gas is made easy.

Preferably, the containers are cassettes that accommodate semiconductor wafers, and the container transfer location is a load port of semiconductor processing equipment, for example. Accordingly, the containers are purged before or after the containers are transferred to a load port so that the semiconductor wafers are able to be processed by the processing equipment.

Preferably, the purging table includes a fixed portion at a position different from the space above the container transfer location (e.g., at a position so as not to occupy a space above the container transfer location), the slide shelf slides between a portion over the fixed portion and the space above the container transfer location, the purging gas feeding device includes at least a feeding nozzle that is provided on the slide shelf and that feeds the purging gas into the containers, and a pipe that feeds the purging gas to the feeding nozzle from the fixed portion; the pipe includes a bendable portion (e.g., a flexible portion) that is able to be bent; and a cable guide supporting the bendable portion bendably is provided between the slide shelf and the fixed portion.

Since the bendable portion is supported by the cable guide, the purging gas is able to be easily supplied to the feeding nozzle on the slide shelf.

Preferably, the slide shelf includes a load sensor that detects a load from a container, and the purging gas feeding device feeds the purging gas through the feeding nozzle, when the load sensor detects a load from a container, and at least a power line and at least a signal line of the load sensor are supported by the cable guide together with the pipe.

The purging gas is able to be supplied when the load sensor detects the load from a container, and therefore, the purging gas is effectively supplied. Further, the cable guide is able to support not only the pipe but also the power line and the signal line, for example.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a fragmentary plan view of the purging apparatus according to a preferred embodiment of the present invention and processing equipment.

FIG. 6 is a plan view of the purging apparatus according to a preferred embodiment of the present invention.

DETAILED DESCRIPTION OF THE PREFERRED EMBODIMENTS

Preferred embodiments of the present invention will be described. The scope of the present invention shall be construed according to the claims, with reference to the specification and well-known arts in the field, in accordance with the understandings of a person skilled in the art.

Figure 1:
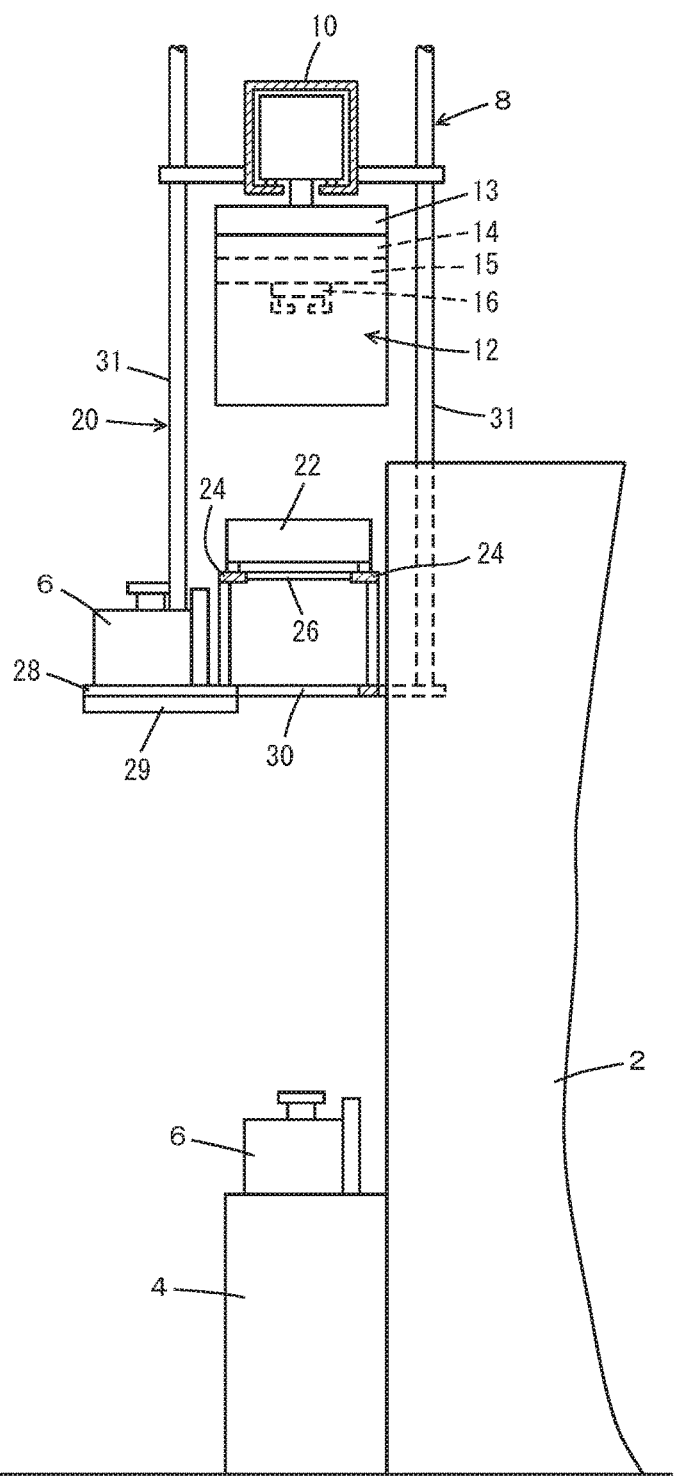
FIG. 1 is a fragmentary front view of a purging apparatus according to a preferred embodiment of the present invention and a surrounding overhead transfer system and a piece of processing equipment.

FIGS. 1-6 show preferred embodiments of the present invention. FIGS. 1 and 2 show the purging apparatus 20 according to a preferred embodiment, and surrounding processing equipment 2 and an overhead transfer system 8. The processing equipment 2 includes load ports 4 which are an example of transfer locations of cassettes 6. The processing equipment 2 is not limited to processing apparatuses, and may be inspection equipment, and so on, and is able to be replaced by a storage of empty cassettes or the like. The cassettes 6 are able to accommodate semiconductor wafers for products, process control wafers, or wafers for inspection purposes and are able to be empty cassettes, for example. Further, they are able to accommodate reticles or the like instead of the semiconductor wafers. In preferred embodiments of the present invention, the cassettes 6 preferably are FOUPs, for example.

The overhead transfer system 8 includes a travelling rail 10 and overhead transfer vehicles 12, the travelling rail 10 passes just over the load ports 4 and are supported from the ceiling of cleanroom and so on. The overhead transfer vehicles 12 include a lateral movement device 13 and a rotation device 14, which move a raising and lowering device 15 laterally and also rotate it, and the raising and lowering device 15 raises and lowers an elevation platform 16 that is able to chuck (e.g., able to hold) the cassettes 6.

The purging apparatus 20 includes at least a local vehicle 22 and a travelling rail 24 for the local vehicle, and the cassettes are able to pass vertically through an open space 26 between a pair of rails of the travelling rail 24. Under the travelling rail 24 is a buffer with a purging function. The buffer includes slide shelves 28 just over the load ports 4, the slide shelves are able to slide along the lateral direction in FIG. 1 (the horizontal and perpendicular direction to the longitudinal direction of the travelling rail 24). The buffer further includes, for example, two fixed shelves 30 at positions remote from the load ports 4 in a plan view. Under a slide shelf 28 is a fixed portion 29 that accommodates a slide mechanism of the shelf and elements to perform purging, and the fixed shelves include purging elements at their bottoms, for example. The purging apparatus 20 is preferably attached by support rods 31 to the travelling rail 10 of the overhead transfer vehicles 12, however, it is able to be supported from the ground. Gases and electricity to perform purging, and so on, are preferably supplied through the support rod 31 or the like from the ceiling of the cleanroom, however, they are able to be supplied from the ground.

Figure 3:
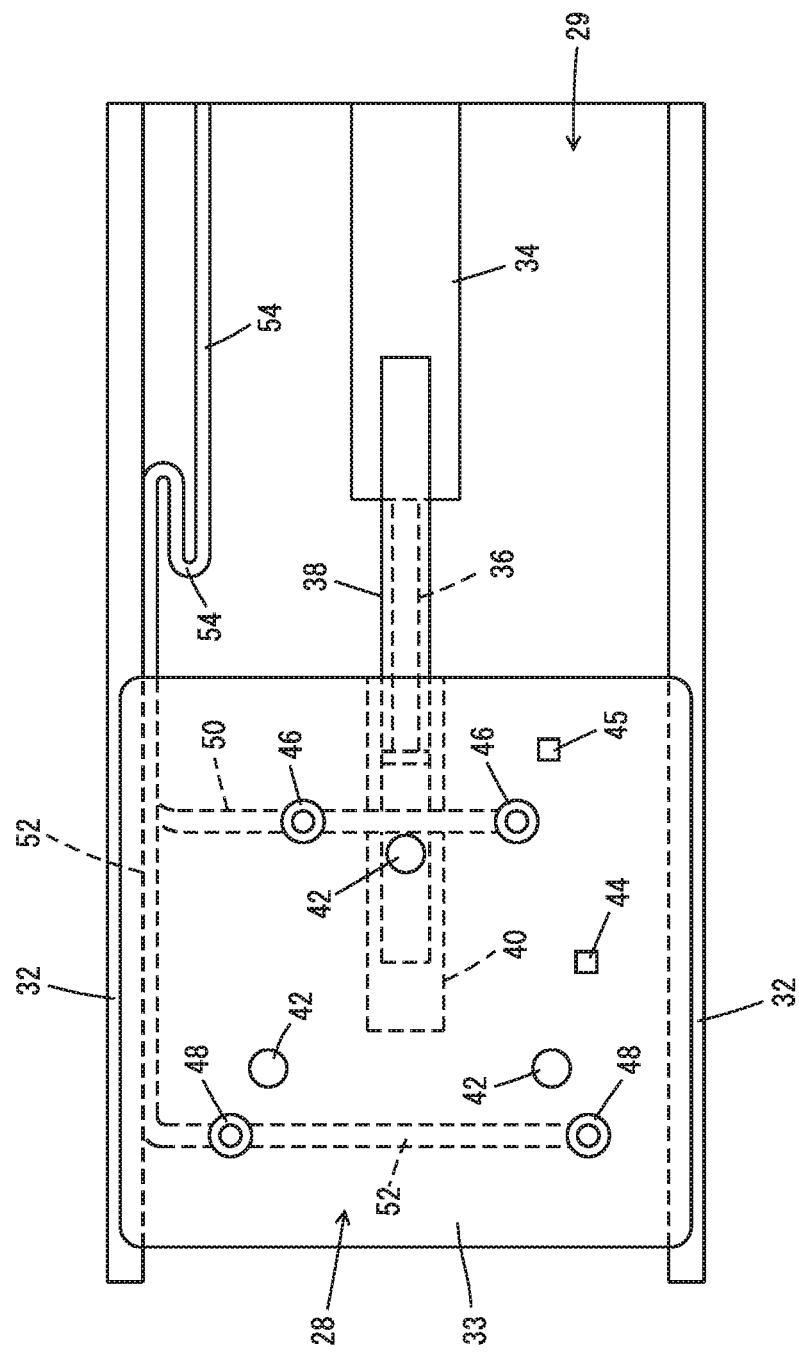
FIG. 3 is a plan view of a slide shelf according to a preferred embodiment of the present invention.

FIG. 3 shows the slide shelf 28, and the slide shelf 28 advances and retracts along a guide 32 relative to the fixed portion 29. The mechanism to perform the sliding is arbitrary, and, for example, a middle portion 38 is fixed to a piston 36 engaged in a cylinder 34 which is driven by $N_2$ gas or the like, so that the middle portion 38 advances and retracts. Further, a double stroke mechanism enables a top portion 40 to advance and retract with a double stroke of the piston 36, and a plate 33 is fixed to the top portion 40 to enable placing the cassettes.

Three coupling pins 42 are preferably provided on the plate 33 so that they define a triangle, or other suitable shape, and they guide the bottom surfaces of the cassettes, a seating sensor 44 detects presence or absence of a cassette, and a load sensor 45 detects presence or absence of a load from a cassette. On the plate 33 are, for example, two feeding nozzles 46, 46, and, for example, two exhaust nozzles 48, 48, a pipe 50 feeds a purging gas such as $N_2$, and a pipe 52 discharges exhaust gas from a cassette. Bellows making portions of the pipes 50, 52 are attached to a cable guide 54 and they bend together with power and signal lines of sensors 44, 45. In a preferred embodiment of the present invention, the exhaust nozzle 48 and the pipe 52 are able to be omitted.

The pipes 50, 52 may include other bendable portions bendable and supported by the cable guide 54 instead of the bellows. The bendable portions may include synthetic resin tubes made of a fluoride resin rubber, or a polyester elastomer, for example. The cable guide 54 includes plural elements that are preferably C-shaped or substantially C-shaped in section and interconnected by pins, the elements are able to bend around the pins, and within the C-shaped or substantially C-shaped groove are accommodated the pipes 50, 52, signal lines and power lines. The fixed shelves 30 preferably have the same or a similar structure as the slide shelves 28 other than the slide mechanism which includes the cylinder 34 and the cable guide 54, for example.

Figure 4:
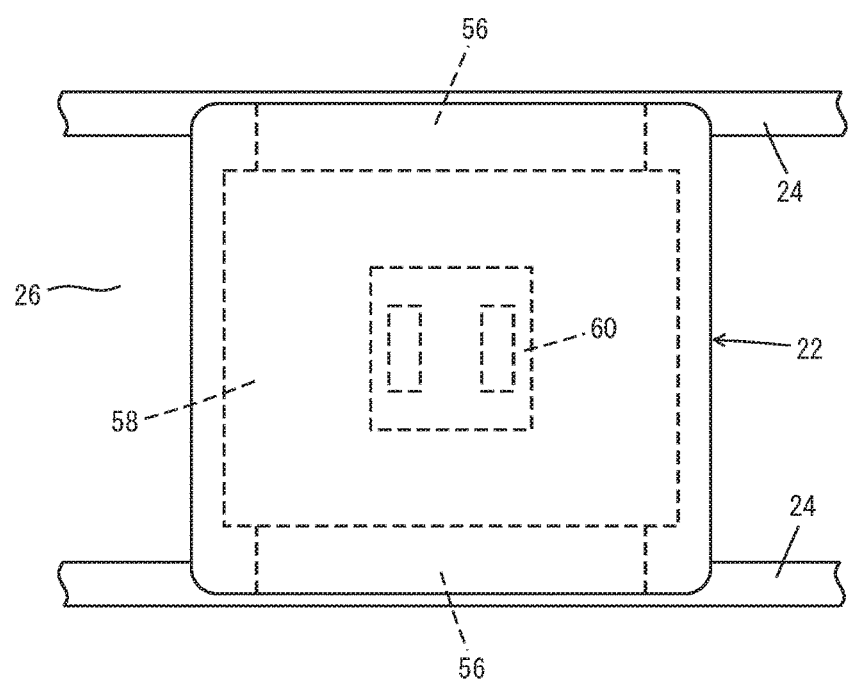
FIG. 4 is a plan view of a local vehicle according to a preferred embodiment of the present invention.

FIG. 4 shows the local vehicle 22 which includes, for example, a pair of travelling units 56 and a raising and lowering device 58, the local vehicle is able to raise and lower an elevation platform 60 including a chuck with the raising and lowering device 58, for example, so as to transfer cassettes between the load ports and shelves 28, 30.

Figure 5:
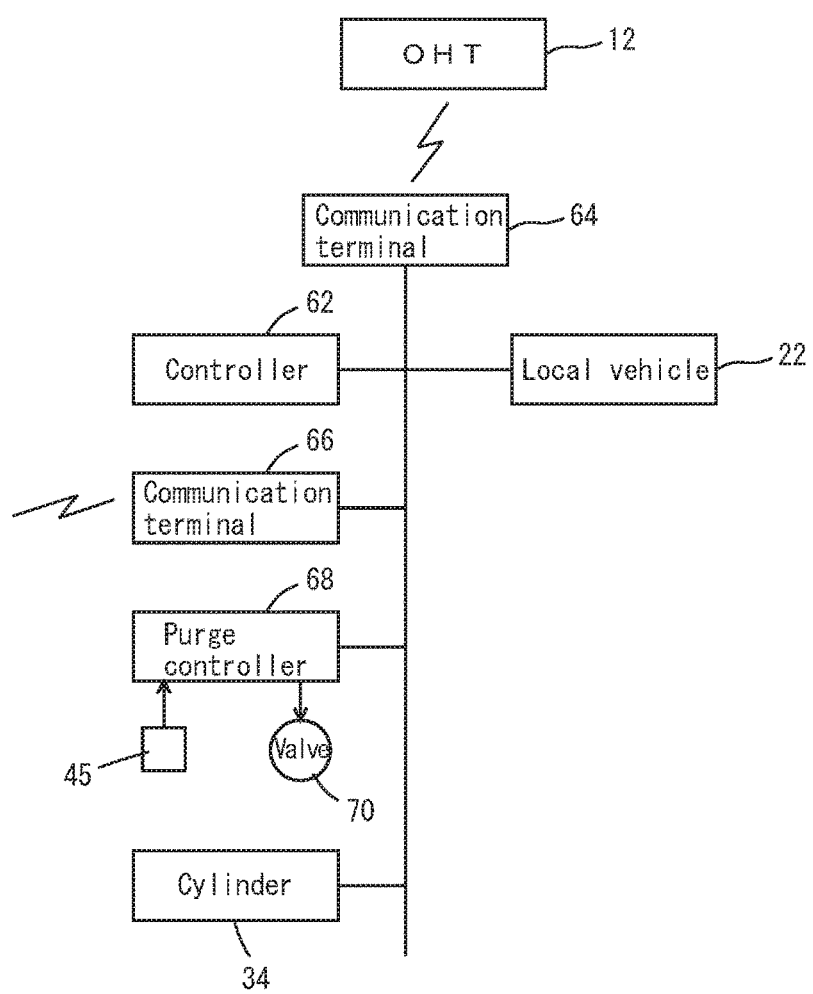
FIG. 5 is a block diagram showing a control system according to a preferred embodiment of the present invention.

FIG. 5 shows the control system of the purging apparatus 20. A controller 62 preferably is configured or programmed to control the purging apparatus 20, and a communication terminal 64 communicates with the overhead transfer vehicles 12 to prevent or reduce interferences between the local vehicle 22 and the overhead transfer vehicles 12. A communication terminal 66 communicates with a host controller and receives instructions regarding transfers within the purging apparatus 20 and regarding whether or not each cassette needs to be, or should be, purged. According to the instructions from the controller 62, when the load sensor 45 detects a cassette placed on a slide shelf in a condition suitable to be purged, then the purge controller 68 opens a solenoid valve 70 provided in a pipe from the ceiling for $N_2$ gas (purging gas) and feeds the purging gas to the feeding nozzles. Further, according to the instructions from the controller 62, the local vehicle 22 and the cylinder 34 operate.

Exemplary operations of preferred embodiments of the present invention are described. Cassettes 6 are transferred from the overhead transfer vehicles 12 or from the load ports 4 on the shelves 28, 30 and are purged with $N_2$ gas or the like in their internal spaces. When the load sensor 45 detects that a cassette is placed at a correct position, the feeding nozzles 46 feed the purging gas, and the exhaust nozzles 48 discharge. As a result, the atmosphere in the cassette is substituted by the purging gas, and oxidation and contamination of semiconductor wafers are prevented or significantly reduced. When the purging is performed after processing in the processing equipment 2, if a long period elapses before arriving at the next processing equipment or the like, the production quality of semiconductors is far less affected than if purging had not been performed. When an already purged cassette 6 is introduced into processing equipment 2, the surface of the semiconductor wafers are cleaned in advance to the introduction into the processing equipment 2, such that the amount of atmosphere introduced into the processing equipment 2 is significantly reduced or prevented. Further, regarding empty cassettes, insides of the cassettes 6 may be cleaned by the purging. Preferably, the cassettes 6 include valves which open due to the pressure from the nozzles 46, 48 and close if the pressure is lost so that the cassettes become airtight.

The slide shelves 28 are able to advance just over the load ports 4, and therefore, loading to the load ports 4 is able to be done promptly. Further, the slide shelves 28 are able to be provided at positions abutting the load ports 4, the number of shelves per unit length of the travelling rail 24 is increased. Loading from a fixed shelf 30 requires both the travelling of the local vehicle 22 and the loading operation, however, loading from a slide shelf 28 does not require the travelling of the local vehicle 22. For example, when the local vehicle 22 chucks a cassette 6, the slide shelf 28 retracts sideways promptly, and the local vehicle 22 is able to start loading without travelling from the spot (e.g., without travelling from its current position). Therefore, if cassettes to be loaded to the load ports 4 are stored on the slide shelves 28 preferentially, the loading of the cassettes 6 to the load ports 4 is more promptly performed.

FIG. 6 shows another preferred embodiment of the present invention. The same symbols in FIGS. 1-5 represent the same elements, and it is similar to preferred embodiments of the present invention shown in FIGS. 1-5 but for particularly indicated points. In addition to the above overhead transfer system 8, another overhead transfer system 72 that is able to transfer cassettes with special attributes in production control such as a hot-lot is provided, respective travelling rails 74, 75 for the overhead transfer systems 8, 72 are arranged parallel or substantially in parallel along an interbay route. If the overhead transfer vehicles 12 are able to directly enter into a bay 77 from the travelling rail 75 of the overhead transfer system 72, then, complex diverging and merging are necessary in the travelling rails. Therefore, conveyors 78, 79 are provided so that they pass below travelling rails 74, 75, and 10, the conveyor 78 is used to transport into the bay 77, and the conveyor 79 is used to transport to the overhead transfer system 72 out of the bay 77. In the bay 77, a loop-shaped travelling rail 76 that passes over slide shelves 28 of, for example, plural purging apparatuses 20 are provided so that transfer vehicles such as the overhead transfer vehicles 12 are able to travel along it, and the slide shelves 28, the conveyors 78, 79, and the overhead transfer system 72 are mutually connected. Further, buffers 80 are provided, and the overhead transfer vehicles 12 travelling along the travelling rail 76 transfer cassettes between the buffers 80 by the lateral movement device 13 in FIG. 1, for example. The buffers 80 are able to be provided with the purge function with the usage of $N_2$ gas, for example.

The overhead transfer vehicles 12 travelling along the travelling rail 76 and the overhead transfer system 72 transfer cassettes such as those accommodating hot-lot wafers for emergent transfer, empty cassettes, and cassettes accommodating process control wafers or wafers for inspection purpose, for example. These cassettes are called cassettes having special attributes in production control. The conveyors 78, 79 connect the overhead transfer system 72 in the interbay route and overhead transfer vehicles travelling the travelling rail 76 in the bay 77. Further, a system including the travelling rail 76 and the overhead transfer vehicles 12 is able to be replaced by an arbitrary system that transfers cassettes in the ceiling space. For example, a gantry crane which two-dimensionally travels in the bay 77, transfer vehicles which travel on a grid-shaped rail over the bay 77, or autonomously guided vehicles which do not block the clean air flow in the bay 77, etc. are able to be used, for example. Further, preferably, these systems should be provided at an area higher than the purging apparatus 20.

The preferred embodiment of the present invention in FIG. 6 enables various purging operations, for example, when transferring a cassette from first processing equipment 2a to second processing equipment 2b, the cassette is transferred to a purging apparatus 20b near or adjacent to the second processing equipment 2b after purging at a purging apparatus 20a near or adjacent to the first processing equipment 2a and further purged at the purging apparatus 20b, before being processed at the second processing equipment 2b. In addition to the purging apparatus 20, the buffers increase the storage capacity in the bay. And, the overhead transfer system 72, the conveyors 78, 79, and travelling rail 76, or the like are preferably able to compensate for the transfer delay due to purging.

Containers to be purged are not limited to the cassettes and are arbitrary, and articles to be accommodated are able to be, for example, medicines, foods, or the like, in addition to the semiconductor wafers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A purging apparatus for purging a container between an overhead transfer vehicle and a container transfer location to or from which the container is transferred, the purging apparatus comprising:
    a local vehicle that travels and includes a hoist that raises and lowers the container;
    a travelling rail for the local vehicle, the travelling rail for the local vehicle being provided below a travelling rail for the overhead transfer vehicle and above the container transfer location;
    a purging table that supports the container, the purging table being provided below the travelling rail for the local vehicle and able to be positioned so as not to occupy a space above the container transfer location; and
    a purging gas feeding device that feeds a purging gas into the container supported on the purging table; wherein
    the purging table includes a slide shelf that slides between a first position so as not to occupy the space above the container transfer location and a second position so as to occupy the space above the container transfer location;
    the purging table further includes a fixed portion positioned so as not to occupy the space above the container transfer location;
    the slide shelf slides between the first position, so as to be positioned above the fixed portion, and the second position;
    the purging gas feeding device includes a feeding nozzle that is provided on the slide shelf and feeds the purging gas into the container, and a pipe that feeds the purging gas to the feeding nozzle from the fixed portion;
    the pipe includes a flexible portion that is able to be bent; and
    a cable guide supporting the bendable portion bendably is provided between the slide shelf and the fixed portion.

2. The purging apparatus according to claim 1, wherein the purging table further includes:
    a fixed shelf; and
    a controller configured or programmed to control the local vehicle and to select which of the slide shelf and the fixed shelf is to support the container such that the container to be transferred to the container transfer location is preferentially purged while supported by the slide shelf.

3. The purging apparatus according to claim 1, wherein the purging apparatus is provided in a ceiling space of a cleanroom and receives the purging gas from the ceiling of the cleanroom.

4. The purging apparatus according to claim 1, wherein the container is a cassette that accommodates a semiconductor wafer; and
    the container transfer location is a load port of semiconductor processing equipment.

5. The purging apparatus according to claim 1, wherein the slide shelf includes a load sensor that detects a load of the container, and the purging gas feeding device feeds the purging gas through the feeding nozzle when the load sensor detects the load from the container; and
    a power line and a signal line of the load sensor are supported by the cable guide together with the pipe.

6. A purging method that uses a purging apparatus that includes a local vehicle that travels and includes a hoist for raising and lowering a container, a travelling rail for the local vehicle, the travelling rail for the local vehicle is provided below a travelling rail for an overhead transfer vehicle and above the container transfer location to or from which the container is transferred, a purging table that supports the container, the purging table is provided below the travelling rail for the local vehicle and able to be positioned so as not to occupy a space above the container transfer location, and a purging gas feeding device that feeds a purging gas into the container supported on the purging table, the purging method comprising:
    placing the container temporarily on the purging table between the overhead transfer vehicle and the container transfer location; and
    purging the container with the purging gas using the purging gas feeding device; wherein
    the purging table includes a slide shelf that slides between a first position so as not to occupy the space above the container transfer location and a second position so as to occupy the space above the container transfer location;
    the purging table further includes a fixed portion positioned so as not to occupy the space above the container transfer location;
    the slide shelf slides between the first position, so as to be positioned above the fixed portion, and the second position;
    the purging gas feeding device includes a feeding nozzle that is provided on the slide shelf and feeds the purging gas into the container, and a pipe that feeds the purging gas to the feeding nozzle from the fixed portion;
    the pipe includes a flexible portion that is able to be bent; and
    a cable guide supporting the bendable portion bendably is provided between the slide shelf and the fixed portion.

* * * * *